United States Patent
Brener et al.

(10) Patent No.: US 9,086,510 B1
(45) Date of Patent: Jul. 21, 2015

(54) ELECTRICALLY TUNABLE INFRARED METAMATERIAL DEVICES

(71) Applicant: Sandia Corporation, Albuquerque, NM (US)

(72) Inventors: Igal Brener, Albuquerque, NM (US); Young Chul Jun, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 310 days.

(21) Appl. No.: 13/908,826

(22) Filed: Jun. 3, 2013

(51) Int. Cl.
*H01L 29/778* (2006.01)
*H01L 31/0735* (2012.01)
*H01L 33/00* (2010.01)
*G02B 1/00* (2006.01)

(52) U.S. Cl.
CPC ............ *G02B 1/002* (2013.01); *H01L 29/7783* (2013.01); *H01L 31/0735* (2013.01); *H01L 33/0062* (2013.01); *H01L 2924/1032* (2013.01)

(58) Field of Classification Search
CPC ............ H01L 29/7783; H01L 31/0735; H01L 33/0062; H01L 2924/1032
See application file for complete search history.

(56) References Cited

U.S. PATENT DOCUMENTS 4,839,702 A * 6/1989 Grinberg et al. ................. 257/23
4,899,200 A * 2/1990 Shur et al. ..................... 257/194

OTHER PUBLICATIONS

Berreman, D.W., "Infrared Absorption at Longitudinal Optic Frequency in Cubic Crystal Films", Physical Review 130 (6), 2193-2198 (1963).

Harbecke, et al., "Optical Properties of Thin Films and the Berreman Effect", Applied Physics A: Materials Science & Processing 38(4), 263-267 (1985).

Hinkey, et al., "Reflectance spectrum of plasmon waveguide interband cascade lasers and observation of the Berreman effect", Journal of Applied Physics, 110 (4), 043113 (2011).

Jun, Y.C., et al., "Electrically tunable infrared metamaterials based on depletion-type semiconductor devices", J. Optics 14, 114013 (2012).

McAlister, et al., "Plasma Resonance Absorption in Thin Metal Films", Physical Review 132 (4), 1599-1602 (1963).

Schubert, et al., "Long-wavelength interface modes in semiconductor layer structures," Physical Review B 71 (3) (2005).

Vassant, et al., "Berreman mode and epsilon near zero mode," Optics Express, 20, 23971 (2012).

Vassant, et al., "Epsilon-Near-Zero Mode for Active Optoelectronic Devices," Physical Review 109, 237401 (2012).

* cited by examiner

*Primary Examiner* — Phat X Cao
(74) *Attorney, Agent, or Firm* — Martin I. Finston

(57) ABSTRACT

A wavelength-tunable, depletion-type infrared metamaterial optical device is provided. The device includes a thin, highly doped epilayer whose electrical permittivity can become negative at some infrared wavelengths. This highly-doped buried layer optically couples with a metamaterial layer. Changes in the transmission spectrum of the device can be induced via the electrical control of this optical coupling. An embodiment includes a contact layer of semiconductor material that is sufficiently doped for operation as a contact layer and that is effectively transparent to an operating range of infrared wavelengths, a thin, highly doped buried layer of epitaxially grown semiconductor material that overlies the contact layer, and a metallized layer overlying the buried layer and patterned as a resonant metamaterial.

7 Claims, 1 Drawing Sheet

ELECTRICALLY TUNABLE INFRARED METAMATERIAL DEVICES

STATEMENT OF GOVERNMENT INTEREST

This invention was developed under Contract DE-AC04-94AL85000 between Sandia Corporation and the U.S. Department of Energy. The U.S. Government has certain rights in this invention.

FIELD OF THE INVENTION

This invention relates to metamaterial-based optical devices for use as filters, switches, modulators, and the like at near to far infrared frequencies.

ART BACKGROUND

There is significant current interest in the development of optical metamaterials for various applications including the processing and control of optical signals in the infrared spectrum. Metamaterial devices intended for such applications would be particularly desirable if the pertinent optical properties of the metamaterials could be actively tuned.

It has previously been shown that electrical control can be used to actively tune mid-infrared resonant frequencies of metallic split-ring resonators (SRRs) by altering carrier concentrations in an underlying semiconductor layer having an appropriate doping level. In that work, SRR arrays operated as an optical metamaterial layer and electrical metal gate simultaneously. With a reverse bias applied to the metal gate, the refractive index of the substrate directly underneath the metallic resonators was varied through changes in the depletion width in the highly doped semiconductor layer.

There is a need for further development of these, and similar ideas, leading to metamaterial-based optical devices exhibiting stronger tuning effects and operating in a broader range of optical frequencies.

SUMMARY OF THE INVENTION

Here we describe a novel depletion-type infrared metamaterial device employing a thin, buried n+ epilayer. The permittivity of this buried n+ layer can become negative (i.e. metallic) at some infrared wavelengths (e.g. Re[$\in$]<0 when $\lambda_0$>14 μm for n+GaAs, $N_D$=5×10$^{18}$ cm$^{-3}$). This highly-doped buried layer optically couples with a metamaterial layer and produces a double-peaked resonance in the transmission spectrum. We can induce a drastic change in the transmission spectrum via the electrical control of this optical coupling.

Accordingly, the invention in one embodiment is an optical device having tunable wavelength selectivity, comprising:

a layer of semiconductor material that is sufficiently doped for operation as a contact layer and that is effectively transparent to an operating range of infrared wavelengths (the "contact layer");

a layer of epitaxially grown semiconductor material (the "buried layer") that overlies the contact layer, is of a thickness not more than 0.025 times a vacuum wavelength in the operating range, and that is doped with the same polarity as the contact layer but at 5 times or more the dopant concentration of the contact layer; and a metallized layer overlying the buried layer and patterned as a resonant metamaterial having at least one absorptive infrared resonance at a wavelength relative to which the buried layer exhibits metallic-dielectric transition behavior.

In embodiments, a barrier layer is included between the buried layer and the metamaterial and has a higher band gap than the buried layer. In embodiments, the barrier layer is of a thickness that is no more than twice the thickness of the buried layer.

In embodiments, the device further includes an arrangement for applying a voltage bias between the metamaterial and the contact layer at least of a polarity that tends to deplete the buried layer of majority carriers.

In embodiments, the buried layer is in sufficient proximity to the metallized layer for electromagnetic coupling to take place, in the infrared operating range of wavelengths, between plasmonic excitations of the metallized layer and plasmonic excitations of the buried layer. In embodiments, the buried layer has a doping level selected such that for some range of gate bias voltages applied to the device, wherein the metallized layer functions as the gate electrode, there is sufficient carrier depletion in the buried layer to extinguish the electromagnetic coupling between plasmonic excitations of the metallized layer and plasmonic excitations of the buried layer.

DETAILED DESCRIPTION

The interaction of resonances in planar metamaterial resonators and thin, doped semiconductor layers is related to the familiar Berreman effect, wherein p-polarized light incident on a thin metallic-like layer can excite surface plasmons in this thin layer. This excitation is evidenced by a minimum in transmission or a maximum in reflection at wavelengths where the permittivity function is zero. In the case of a Drude-like layer, this wavelength is the plasma frequency.

Figure 1:
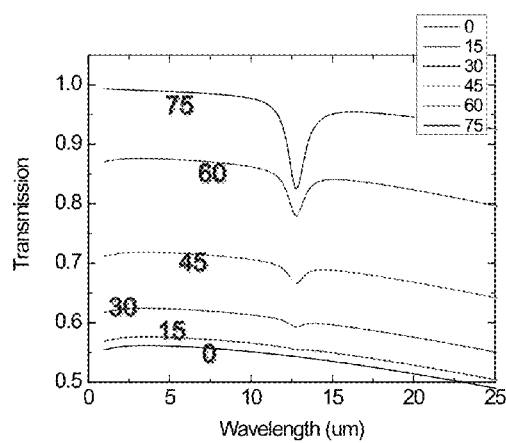
FIG. 1 provides a set of theoretical transmission spectra at different values of the incidence angle for p-polarized light. The structure that has been modeled consists of a single 100-nm thick layer of n+ GaAs (Drude-behavior) on top of a semi-insulating GaAs substrate. The strong dip in transmission for oblique angles corresponds to roughly the plasma frequency.

For example, FIG. 1 provides an illustrative optical transmission spectrum, at varying angles of incidence of p-polarized light, of a 100-nm-thick layer of n+ GaAs (which exhibits electrical conductance that accords with the Drude model) overlying a semi-insulating GaAs substrate. As seen in the figure, there are curves for six angles of incidence, varying from 0 to 75 degrees in increments of 15 degrees. The strong dip in transmission seen at the most oblique angles corresponds approximately to the plasma frequency.

In related work, the possibility of utilizing a mode of surface-phonon polaritonic excitation in metamaterial-sensitized III-V semiconductors was recently discussed in S. Vassant et al., "Epsilon-Near-Zero Mode for Active Optoelectronic Devices", *Physical Review Letters* 109, 237401 (2012), hereinafter "Vassant (2012)". In that work, the surface waves were used to enhance electronic interactions in a AlGaAs/GaAs/AlGaAs quantum well. To overcome the difficulties of such an approach, the authors utilized the so-called epsilon-near-zero (ENZ) effect, whereby the electric field near the interface between two dielectrically dissimilar materials may be substantially enhanced due to the well-known requirement from electrostatics that the normal component of the electric displacement must be continuous across the interface. Adopting a notation in which $\in_{ij}$ is the is the diagonal complex dielectric tensor and E is the electric field, an ENZ enhancement factor $K_{ENz}$ is defined by $K_{ENZ}=|E_{z2}/E_{z1}|^2=|\in_{zz1}/\in_{zz2}|^2$ for instances in which $|\in_{zz2}|<<|\in_{zz1}|$. The factor $K_{ENz}$ describes the amount by which the field in medium 2 is enhanced relative to medium 1.

The authors observed that consideration of the real part of the dielectric function in bulk gallium arsenide (GaAs) and bulk $Al_{0.33}Ga_{0.67}As$ shows that for this system, $K_{ENZ}$ is greater than 50 over a spectral range of about 290-294 $cm^{-1}$. This defines the ENZ regime. Further consideration shows that the real parts of the respective dielectric constants have opposite signs over a spectral range of about 276-285 $cm^{-1}$. This defines the regime in which a surface phonon polariton (SPhP) can exist at the interface. Accordingly, it will be understood that the ENZ and SPhP frequency ranges do not overlap for this geometry.

However, in a geometry in which a slab of GaAs is embedded in AlGaAs, SPhPs propagating at both interfaces can couple, leading to a splitting of the SPhP dispersion relation in two branches, which correspond to modes in which the normal electric field distribution is respectively symmetric and antisymmetric. The splitting increases as the slab thickness decreases.

The authors found that for a slab thickness of 22 nm, the frequency of the higher energy branch enters the ENZ frequency range but remains smaller than the longitudinal optical phonon frequency of GaAs so that the real part of the dielectric function is negative and the requirements for an SPhP excitation are satisfied.

The authors referred to this excitation as the ENZ mode. They observed that the field was confined in the quantum well and that the amplitude in GaAs was more than an order of magnitude larger than in $Al_{0.33}Ga_{0.67}As$. The authors compared this system to a pair of surface plasmons propagating along a thin metallic film, in which there is also a metal-like medium embedded in a dielectric. The ENZ mode has the same field symmetry as the long-range surface plasmon, i.e., symmetric normal electric field). However, the respective excitations have different field distributions, and the ENZ mode dispersion relation is almost flat for a large range of wave vectors, with $\approx \omega_{GaAs,LO}$.

The authors then described a scheme for the electrical control of infrared reflectivity based on resonant absorption by the ENZ mode. In that scheme, incident light is coupled through a grating to the ENZ mode. The 22-nm thick GaAs layer forms a quantum well having an inter-subband transition energy near that of the ENZ mode. Due to the transition energy, the z-component of the quantum well dielectric tensor depends on the electron density in the well and consequently can be tuned by a gate voltage. This affords electrical control of the ENZ enhancement, and consequently of the infrared optical absorption.

In an experimental demonstration, reflectivity spectra taken with a p-polarized incident wave exhibited 76% absorption at a wavelength of 34.3 μm, corresponding to the longitudinal optical phonon frequency 8.74 THz, when a negative gate voltage is applied to deplete the QW and thus cancel the contribution to the dielectric constant from the inter-subband transition energy.

We have further improved upon these, and other, ideas to provide a concept for a tunable metamaterial device. A further principle upon which our device operates is that when metamaterial resonators are placed in proximity a thin doped layer as mentioned above, there will be a strong interaction between the resonator, the surface plasmon of the doped layer, and an incident optical field at or near the resonant frequency. If the electron density in these thin layers can be varied by e.g., depletion, there is an opportunity for active frequency-tuning of the metamaterial device.

We have, in fact, made and tested a device that operates according to the abovesaid principle. An embodiment of the device is shown schematically in FIG. 2. It should be understood that the illustrated embodiment is purely exemplary, and not meant to be limiting. Indeed, the principles described here allow for numerous variations and alternative embodiments without deviating from the spirit and scope of the invention.

Figure 2:
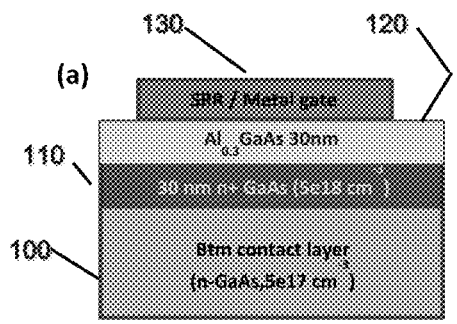
FIG. 2 provides a schematic diagram of an optical device according to an embodiment of the invention.

Turning now to the schematic diagram of FIG. 2, it will be seen that the device includes a thick bottom contact layer 100 ($N_D$=5×10$^{17}$), a thin n+ GaAs buried layer 110 (30 nm, $N_D$=5×10$^{18}$ $cm^{-3}$), and an insulating barrier layer 120 (30 nm $Al_{0.3}Ga_{0.7}As$).

A planar metamaterial layer 130 consisting of interconnected gold split-ring resonator arrays is fabricated on top of this substrate. It works both as an optical metamaterial layer and electrical metal gate simultaneously. For the latter purpose, a large array of metamaterial resonators are connected together to form a large top metallic gate. The depletion width in the buried n+ layer 110 increases with a negative gate bias, inducing a spectrum change, as will be seen below.

Metamaterial 130 is dimensioned for optical resonance at or near the wavelength where Re[∈] for layer 110 reaches zero. Methods for the geometrical tuning of split ring resonator arrays and other such metamaterials are well known and need not be described here in detail.

As noted, layer 110 is exemplarily 30 nm thick. More generally, this layer needs to be at the right thickness to support ENZ waves, as described above. For resonant wavelengths in the mid-infrared, appropriate thicknesses are in the range 10-50 nm. These dimensions will scale for different wavelength ranges.

The depth of burial of layer 110 must be shallow enough for layer 110 to couple to the evanescent electric field of the metamaterial resonators. The penetration depth of that field depends on the background refractive index and the wavelength of operation. For the exemplary wavelengths considered here, that depth is at most a few hundred nanometers. In fact, the depth of burial may be extremely small, provided there intervenes an insulative layer between layers 110 and 130, or else carrier depletion in layer 110 will not be achievable.

Figure 3:
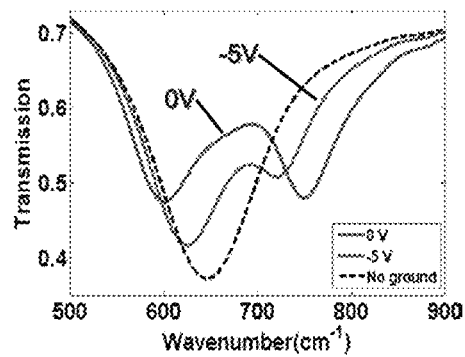
FIG. 3 provides a set of transmission spectra of the modeled device for several gate bias voltages. The spectrum represented by the lowermost, broken line corresponds to the case in which the n+ region is completely depleted.

FIG. 3 provides a simulated transmission spectrum as a function of gate bias voltage. As seen in the figure, there are curves for the following values of the bias voltage: 0V, -5V, and for complete depletion of region 110. As seen in the figure, the transmission spectrum initially (i.e., at zero applied volts) exhibits a double peak, attributable to strongly coupled resonances in the metamaterial and in the ENZ mode. With an increased negative bias, the two peaks get closer to each other. When the buried n+ region is completely depleted, the optical coupling between the metamaterial layer and doped buried layer is destroyed, and the transmission becomes a single peak (lowermost, broken line).

Such behavior is quite different from previously reported depletion-type metamaterial devices. In earlier devices, the change in the depletion width simply induced a change of the substrate permittivity, leading to frequency tuning of the metamaterial resonance. By contrast, the approach described here uses the electric gate bias to dynamically control the optical coupling between the metamaterial layer and doped buried layer. This can produce a marked change in the transmission spectrum, such as the merging of a double peak into a single peak as seen above.

For example, Vassant (2012) as explained above demonstrated modulation of light absorption in quantum wells using a grating structure. However, the delicate optical coupling that we have described was absent from that work. Moreover, the Vassant device worked only at surface "phonon" frequency, which is a material property that cannot be tuned unless different semiconductors are used. By contrast, our device utilizes resonant coupling between semiconductor and metamaterial layers to maximize spectral tuning (potentially in both amplitude and frequency), and it uses a doped semiconductor that allows for ENZ frequency tuning simply by varying the doping density.

One of our significant findings is that the doped region 110 can be made very thin and still produce a substantial change in the spectra when the metamaterial is resonant and close. Such thin layers are very compatible with depletion approaches. Our new depletion-type metamaterial devices have potential applications as filters, switches, and modulators at near to far infrared frequencies. Such devices can potentially be used in tunable reflection, tunable transmission, or both. Numerous configurations for filters, switches, modulators, and the like, based on tunable transmissive or reflective elements, are well-known in the art and need not be described here in detail.

Although in our example, operation in the spectral range of about 600-800 $cm^{-1}$ is indicated, it should be understood that this range is merely illustrative and not meant to be limiting. In fact, devices of the kind described here will be operable in various wavelength ranges, provided that the electrical permittivity of the doped semiconductor of layer 110 reaches 0. For semiconductor materials, the wavelengths of operation could possibly be as short as the near infrared (~1.5 um). Even shorter wavelengths of operation might be possible if the semiconductors are replaced by materials of other kinds. With specific reference to semiconductors, we note that for such materials the doping density dictates the wavelength range that can be used. Increasing the wavelength of operation may be achievable in semiconductors by reducing the doping density. Decreasing the wavelength could be achieved by increasing the doping density up to the maximum that is practicable, which is typically in the range $10^{19}$-$10^{20}$ $cm^{-3}$.

The scope of semiconductor materials that could be used extends to any doped semiconductor that fulfills the conditions required for the existence of ENZ waves as described above, including the requirement that for some dopant level or effective dopant level, the permittivity function goes to zero. Alternatives to semiconductor materials that may also be suitable, and that could be regarded, effectively, as constituting doped layers include graphene and various oxide materials, provided carrier depletion from layers of those materials can be effectuated.

It should also be noted that although our exemplary buried highly doped layer 110 is n+ doped, alternative embodiments are possible in which p+ doping is used instead.

In exemplary fabrication processes, MBE, MOCVD, or the like is used to epitaxially grow high-quality layered structures. The contact to the bottom layer can be made by standard semiconductor processing techniques, for example etching the top, stopping at the bottom n+ layer, and then performing metal evaporation. (Alternative techniques are also feasible, such as those involving etching from the back.). The top contact is provided by the interconnected metamaterial resonator arrays.

The invention claimed is:

1. An optical device having tunable wavelength selectivity, comprising:
    a layer of semiconductor material that is sufficiently doped for operation as a contact layer and that is effectively transparent to an operating range of infrared wavelengths (the "contact layer");
    a layer of epitaxially grown semiconductor material (the "buried layer") that overlies the contact layer, is of a thickness not more than 0.025 times a vacuum wavelength in the operating range, and that is doped with the same polarity as the contact layer but at 5 times or more the dopant concentration of the contact layer; and
    a metallized layer overlying the buried layer and patterned as a resonant metamaterial having at least one absorptive infrared resonance at a wavelength relative to which the buried layer exhibits metallic-dielectric transition behavior.

2. The device of claim 1, further comprising a barrier layer between the buried layer and the metamaterial, wherein the barrier layer has a higher band gap than the buried layer.

3. The device of claim 2 wherein the barrier layer is of a thickness that is no more than twice the thickness of the buried layer.

4. The device of claim 1, further comprising an arrangement for applying a voltage bias between the metamaterial and the contact layer at least of a polarity that tends to deplete the buried layer of majority carriers.

5. The device of claim 1, wherein the buried layer is in sufficient proximity to the metallized layer for electromagnetic coupling to take place, in the infrared operating range of wavelengths, between plasmonic excitations of the metallized layer and plasmonic excitations of the buried layer.

6. The device of claim 5, wherein the buried layer has a doping level selected such that for some range of gate bias voltages applied to the device, wherein the metallized layer functions as the gate electrode, there is sufficient carrier depletion in the buried layer to extinguish the electromagnetic coupling between plasmonic excitations of the metallized layer and plasmonic excitations of the buried layer.

7. The device of claim 1, wherein the buried layer is n+ doped.

* * * * *